United States Patent [19]

Yarbrough

[11] Patent Number: 5,334,939
[45] Date of Patent: Aug. 2, 1994

[54] GROUND FAULT CIRCUIT BREAKER TEST CIRCUIT FOR PANELBOARDS HAVING MINIMUM PENETRATIONS AND TESTING CIRCUIT BREAKERS WITHOUT OPENING PANELBOARD ENCLOSURE

[75] Inventor: Garrett S. Yarbrough, Manlius, N.Y.

[73] Assignee: Cooper Industries, Inc., Houston, Tex.

[21] Appl. No.: 975,858

[22] Filed: Nov. 13, 1992

[51] Int. Cl.⁵ .............................................. H02B 1/04
[52] U.S. Cl. .................... 324/424; 324/509; 340/639
[58] Field of Search ............... 324/424, 415, 418–419, 324/509, 555; 340/638, 639, 644

[56] References Cited

U.S. PATENT DOCUMENTS

| | | | |
|---|---|---|---|
| 3,699,433 | 10/1972 | Smith, Jr. | 340/638 |
| 3,852,660 | 12/1974 | Maier et al. | 324/28 R |
| 3,855,557 | 12/1974 | Gryctko | 335/42 |
| 4,010,432 | 3/1977 | Klein et al. | 335/18 |
| 4,081,852 | 3/1978 | Coley et al. | 361/45 |
| 4,156,121 | 5/1979 | Klein et al. | 200/293 |
| 4,281,322 | 7/1981 | Nasu et al. | 340/638 |
| 4,282,500 | 8/1981 | Ducroquet et al. | 335/18 |
| 4,680,672 | 7/1987 | May et al. | 361/353 |
| 5,151,842 | 9/1992 | DeBiasi et al. | 361/353 |
| 5,168,261 | 12/1992 | Weeks | 324/424 |

FOREIGN PATENT DOCUMENTS 2124786A 2/1984 United Kingdom ............... 324/424

Primary Examiner—Kenneth A. Wieder
Assistant Examiner—Jay M. Patidar
Attorney, Agent, or Firm—Conley, Rose & Tayon

[57] ABSTRACT

A ground fault circuit interrupter (GFCI) circuit breaker test circuit for use with panelboards uses a selector switch, normally open switch, and a resistor to simulate a fault condition at the load output node of any one of several GFCI circuit breakers. This arrangement allows for testing of the circuit breakers while eliminating the need to use an external test actuator to operate the manual test button of each circuit breaker. Thus, shaft penetrations through the panelboard enclosure are minimized, resulting in reduced hazards, increased reliability, easier testing, and greater economy.

19 Claims, 3 Drawing Sheets

GROUND FAULT CIRCUIT BREAKER TEST CIRCUIT FOR PANELBOARDS HAVING MINIMUM PENETRATIONS AND TESTING CIRCUIT BREAKERS WITHOUT OPENING PANELBOARD ENCLOSURE

TECHNICAL FIELD OF THE INVENTION

The present invention relates to ground fault circuit interrupter (GFCI) circuit breakers housed in a panelboard enclosure, and more specifically, to a test circuit for verifying proper operation of the circuit breakers. Still more particularly, the present invention discloses the means to test multiple GFCI circuit breakers without opening the panelboard enclosure while using a minimal number of external actuators.

BACKGROUND OF THE INVENTION

This invention relates to the testing of circuit breakers used in connection with ground fault circuit interrupters. More particularly, the invention allows the testing of multiple ground fault circuit interrupter circuit breakers in a panelboard assembly without opening the panelboard enclosure while using a minimal number of external actuators.

In a three wire system, a ground fault circuit interrupter (GFCI) circuit breaker constantly monitors electricity flowing into a load to sense an imbalance between the line current flowing into the load and the neutral current flowing out of the load. Any difference in these values, beyond a certain threshold, is assumed to be caused by an improper (i.e., unwanted or dangerous) connection between the line and ground wires. The GFCI unit actuates the circuit breaker to remove power from the load when the threshold value is exceeded. A trip lever is included on the circuit breaker, allowing the breaker to be turned on or off, or to indicate that the GFCI has tripped (actuated) the breaker. A manual test switch is included on the GFCI circuit breaker to verify its proper operation.

Two standard threshold current values are used in circuit breakers, 5 milliamps and 30 milliamps. Typically, a circuit breaker which trips for fault current values of 5 milliamps or greater is called a "ground fault circuit interrupter circuit breaker". A circuit breaker which trips for fault current values of 30 milliamps or greater is sometimes called an "Equipment Protection Device". In the interest of brevity, the present disclosure refers to both devices as GFCI circuit breakers.

In current panelboard constructions, the correct operation of a GFCI circuit breaker is verified by depressing the test button on the circuit breaker. This often requires opening the panelboard cover to access the circuit breaker. Alternatively, external test actuators can be added to eliminate the need to open the panelboard cover. Depressing the external test actuator will in turn actuate the test button on the circuit breaker.

GFCI circuit breaker test procedures are further complicated in panelboards used in hazardous Class I (gaseous) and Class II (dust) locations. Testing procedures in these hazardous locations are governed by National Electrical Code (N.E.C.) classifications for areas where the use of electrical equipment can cause ambient gas or dust to explode. In these areas, circuit breakers must be enclosed in an explosion-proof panelboard. The National Electrical Manufacturers Association also provides standard ratings regarding the capability of a panelboard enclosure to withstand potentially hazardous environmental conditions, such as water and corrosion.

The purpose of an explosion-proof panelboard enclosure is to minimize the hazards of electrical arcing in environments where such arcs can cause an explosion. Common plant safety procedures require areas to be classified safe before opening any explosion-proof panelboard enclosure. Consequently, opening the enclosure to perform routine circuit tests on GFCI circuit breakers is not practical.

To avoid the problem of opening the panelboard enclosure, external test actuators can be used to actuate the GFCI test button. However, this design requires that each individual external actuator meet the construction requirements for hazardous location equipment. For each test actuator, a shaft has to penetrate the panelboard enclosure. Each shaft penetration through the enclosure must meet the flamepath length and tolerances of applicable national safety standards. Complying with these standards can be cost prohibitive. Furthermore, each additional shaft reduces the overall reliability of the explosion-proof panelboards by increasing the number of openings in the enclosure that can corrode. In wet areas, each shaft increases the possibility of water leaking into the enclosure.

Two types of shafts may be used to meet flamepath requirements, smooth-sided cylindrical shafts and threaded shafts. Smooth-sided cylindrical shafts are capable of either rotational or transnational motion. Threaded shafts are rotated during operation.

Explosion-proof construction means that each shaft has to prevent flamepath propagation through its entry. For smooth-sided cylindrical shafts, this is accomplished by providing a close tolerance fit between the shaft and its mating bushing and specifying a minimum length of shaft-bushing contact. For threaded shafts, this is accomplished by specifying a minimum number of engaged threads between the shaft and bearing. If the panelboard is to be used outdoors, additional weather-sealing preferably would be added. Typically, close tolerance shafts, bearings, and bushings are made of stainless steel to minimize corrosion buildup in the shaft-bushing or shaft-bearing interface. Each shaft assembly requires precision machining, which also adds to the cost of the test circuit.

The present invention substantially reduces the problems and costs associated with testing GFCI circuit breakers installed in panelboards. This is accomplished by minimizing the number of shafts required to test the GFCI circuit breaker. In the present invention, only two shafts are necessary to actuate a selector switch and one push-to-test button. In the alternative, one skilled in the art will recognize that only one shaft penetration is necessary if a combination push button/selector switch device is used. The selector switch eliminates the need for individual push-to-test buttons and shafts for each branch circuit incorporating a GFCI circuit breaker. This feature minimizes machining and parts, thus reducing cost for explosion-proof panelboards. One skilled in the art will immediately realize that this structure is not restricted to explosion-proof designs, but also can be incorporated into ordinary circuit breaker panels.

Other objects and advantages of the present invention will become apparent upon reading the following description.

SUMMARY OF THE INVENTION

The present invention implements a test circuit for testing multiple GFCI circuit breakers installed in a panelboard enclosure. The test circuit includes a normally open switch, a load resistor, and a rotary or selector switch having a single pole with multiple positions. Each GFCI circuit breaker includes a manual test button and a trip lever to facilitate testing of the device. In addition, each GFCI circuit breaker also includes a load output terminal and a neutral output terminal which supply power to a load.

In a three wire system including line, neutral, and ground wires, the GFCI circuit breaker senses any difference between the current flowing out of its load output terminal and the current flowing into its neutral output terminal. If this difference exceeds a pre-determined value (usually 5 milliamperes or 30 milliamperes), the current is considered to be "leaking" to ground. When the GFCI circuit breaker senses this differential, the circuit breaker "trips", shutting off power to the load. Such an excessive fault current indicates an unwanted or dangerous connection between the load output terminal and the system ground.

The present test circuit allows for the testing of multiple GFCI circuit breakers without opening the panelboard enclosure, while using a minimal number of external actuators. This is accomplished by adding a circuit comprising a normally open switch and a series-connected load resistor. One end terminal of this circuit connects to ground, while the other end terminal connects to the common terminal of a rotary switch. Each position terminal of the rotary switch connects to the load output terminal of a GFCI circuit breaker.

When the normally-open switch is closed, through an external actuator, a current is drawn through the load resistor, simulating a fault current. The current flows from the load output terminal of the selected GFCI circuit breaker, through the load resistor, to ground. Closing the normally-open switch should cause a properly operating GFCI circuit breaker to trip. Thus, closing the normally open switch tests the operation of the selected GFCI circuit breaker.

The design of the test circuit reduces the number of external actuators needed to test multiple GFCI circuit breakers located in a panelboard enclosure. Through the addition of the rotary switch, multiple GFCI circuit breakers can be tested with just two external actuators; one test switch and one rotary switch. This combination effectively replaces the previous testing method which used individual external actuators to operate the test button on each GFCI circuit breaker. In prior art test circuits, n shaft penetrations were required to test n GFCI circuit breakers. The present invention, conversely, can test n GFCI circuit breakers with only two shaft penetrations. In the alternative, one skilled in the art will recognize that only one shaft penetration is necessary if a combination push button/selector switch device is used. Accordingly, the present invention reduces both the hazards and costs of building and testing panelboard enclosed GFCI circuit breakers, especially for those enclosed in explosion-proof panelboards.

These and other objects of the present invention will become apparent from the accompanying drawings, specifications, and claims which are a part of this application.

BRIEF DESCRIPTION OF THE DRAWINGS

For a detailed description of the preferred embodiment of the invention, reference will now be made to the accompanying drawings wherein.

DESCRIPTION OF THE PREFERRED EMBODIMENT

The present invention facilitates the testing of multiple GFCI circuit breakers for use in panelboards using a minimum of external actuators.

Figure 1:
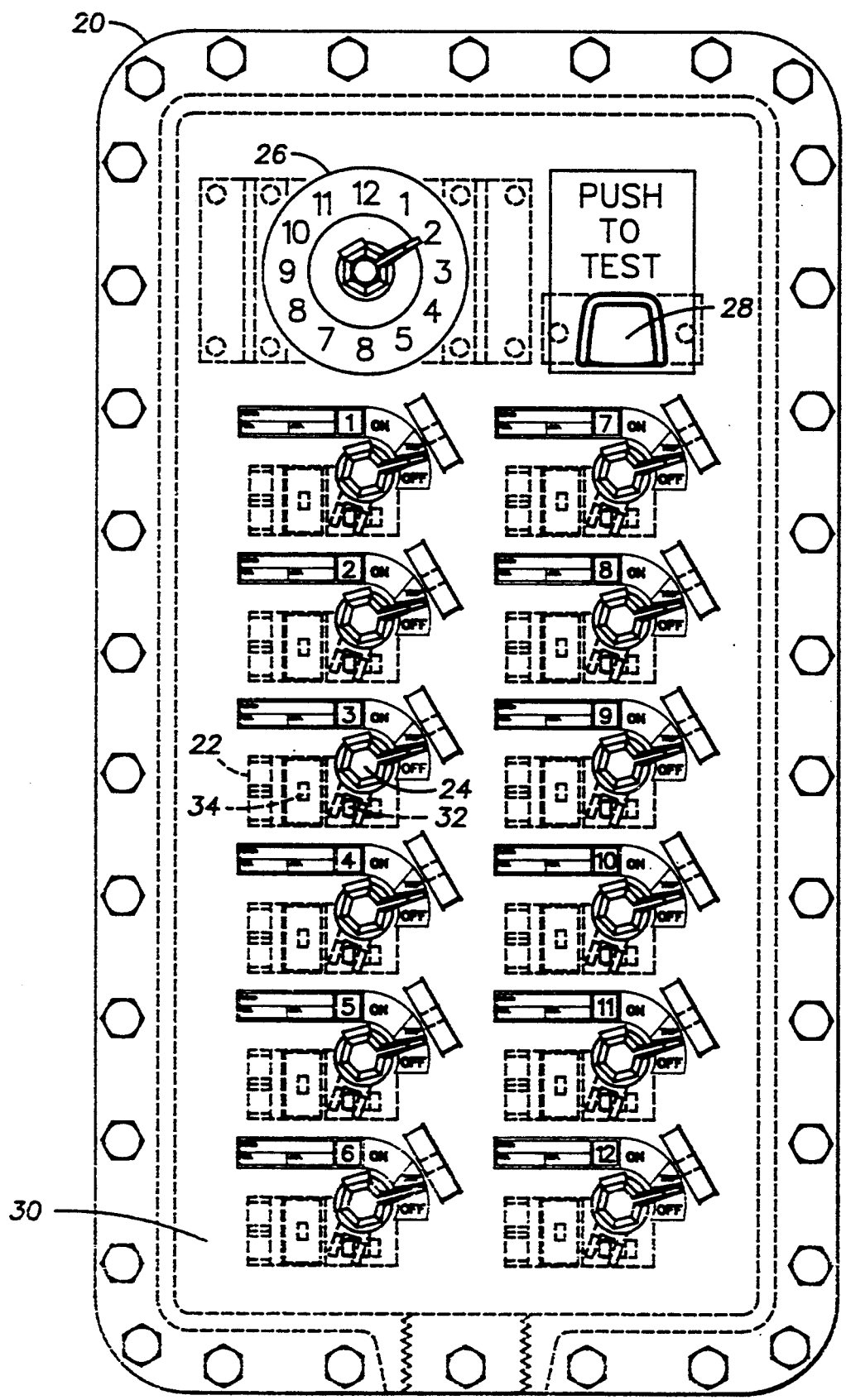
FIG. 1 is a front panel view of the GFCI circuit breaker test operators mounted in an explosion-proof panelboard.

Referring initially to FIG. 1, a panelboard 20 contains multiple GFCI circuit breakers 22. For purposes of explanation, twelve branch circuits numbered 1 through 12, each containing a GFCI circuit breaker 22, are shown. Virtually any number of GFCI circuit breakers 22 could be used in an application. A trip lever 32 is included on each GFCI circuit breaker 22, allowing the breaker to be turned on or off, or to indicate that the GFCI unit (not shown) has tripped the breaker. A manual test button 34 is included on each GFCI circuit breaker to verify its operation.

A trip lever actuator 24 is associated with each GFCI circuit breaker 22. Each trip lever actuator 24 utilizes a shaft penetration through the panelboard cover 30 in order to actuate the trip lever 32. In the present invention, selection actuator 26 and push button actuator 28 are the only other external actuators necessary to test the GFCI circuit breakers 22. However, one skilled in the art will immediately recognize that only one external actuator is necessary if the selection actuator and push button actuator are combined in one device.

Figure 2:
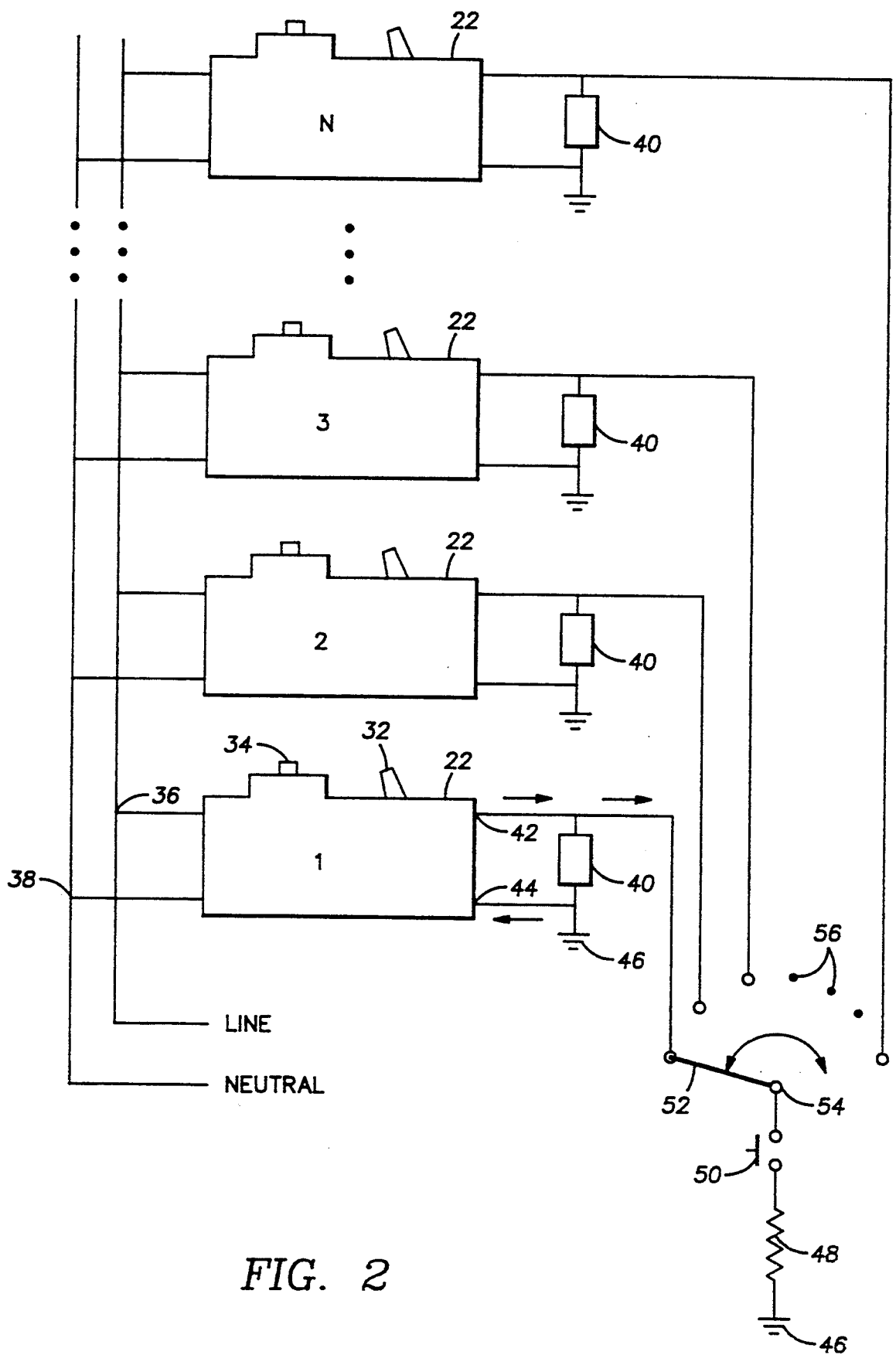
FIG. 2 is a schematic diagram of the GFCI circuit breaker test circuit.

Referring now to FIG. 2, multiple GFCI circuit breakers 22 are shown schematically. Each GFCI circuit breaker 22 receives power at a line input terminal 36 and a neutral input terminal 38 and connects to a load 40 at load output terminal 42 and neutral output terminal 44. A manual test button 34 and a trip lever 32 are incorporated into each GFCI circuit breaker 22, in accordance with conventional techniques.

In a three wire system, as shown in FIG. 2, with a line voltage, neutral and ground, a GFCI circuit breaker 22 measures the differential in the line current ($I_L$) flowing into the load 40 and the neutral current ($I_N$) flowing out of the load 40, as illustrated for branch circuit 1. Any difference in these values, beyond a certain threshold current value ($I_T$), is assumed to be due to an improper (i.e., unwanted or dangerous) connection between the line and ground wires. This difference can be referred to as a fault current ($I_F$). Mathematically, $I_F = |I_L - I_N|$.

The GFCI unit (not shown) actuates (i.e., "trips") the circuit breaker to remove power from the load whenever the fault current exceeds the threshold current value. Thus, whenever $I_F > I_T$, the GFCI circuit breaker 22 turns off, removing power from the load 40. When this happens, the trip lever 32 is mechanically moved from the "on" position to the "tripped" position to indicate that a fault has occurred. Using the trip lever 32, the operator can then reset or turn off the GFCI circuit breaker 22 by setting the lever to its "on" or "off" position, respectively.

The GFCI circuit breaker 22 can be tested by temporarily simulating a ground fault current between its load output terminal 42 and ground node 46. Test load resistor 48 is used for this purpose. Test switch 50, a normally open switch, connects in series to test load resistor 48. One end terminal of this series combination is connected to ground node 46. The second end terminal of this series combination is connected to common terminal 54 of the rotary switch 52. Each of the selectable terminals 56 of the rotary switch 52 is connected to a different GFCI circuit breaker's load output terminal 42.

Figure 3:
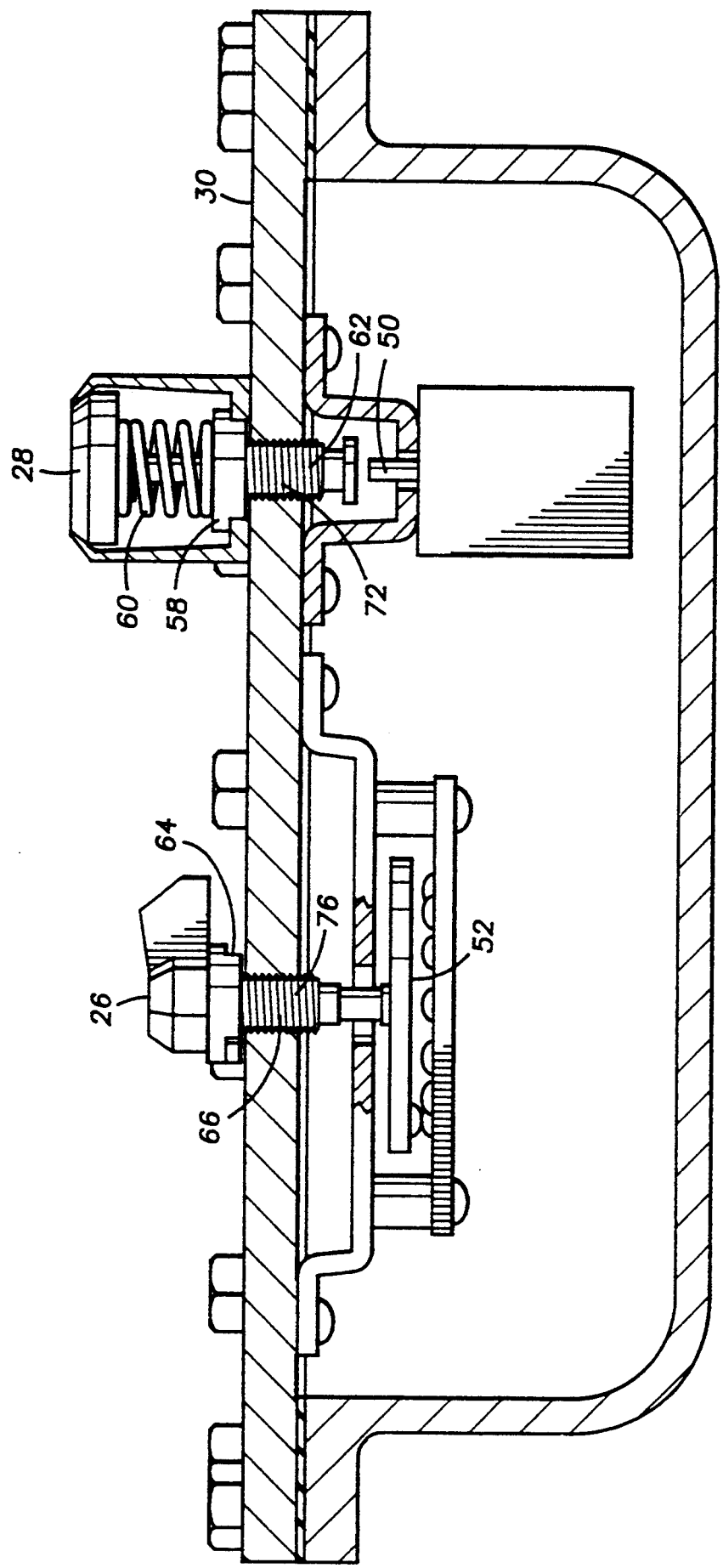
FIG. 3 is a diagram in cross-section of GFCI circuit breaker test operators mounted in an explosion-proof panelboard.

This configuration allows any of the GFCI circuit breakers 22 to be tested by setting the rotary switch 52 and closing the test switch 50. As shown in FIG. 3, selection actuator 26 is used to set rotary switch 52 without opening the panelboard cover 30. Similarly, push button actuator 28 is used to depress test switch 50 without opening the panelboard cover 30. Test load resistor 48 (FIG. 2) simulates a ground fault condition at the load output terminal 42 (FIG. 2) of the GFCI circuit breaker 22 which has been selected.

Through this arrangement the need for an external actuator to operate each manual test button 34 on each GFCI circuit breaker 22 has been eliminated. A push button actuator 28 and a selection actuator 26, requiring only two shaft penetrations, replace the need for multiple actuators and their corresponding shaft penetrations. Note that multiple trip lever actuators 24 are still required to operate each trip lever 32, as shown in FIG. 1.

Referring again to FIG. 2, the chosen value ($R_T$) of test load resistor 48 will depend generally on the voltage ($V_L$) at load output terminal 42 and on the threshold current value ($I_T$) of the GFCI circuit breaker 22. The value ($R_T$) of test load resistor 48 is chosen to be slightly less than the value ($V_L$) of the load output voltage divided by the threshold current ($I_T$). Thus, if the voltage at load output terminal 42 is 120 volts a.c. ($V_L = 120$ v) and a GFCI circuit breaker 22 utilizes a 5 milliamp threshold current value ($I_T = 5$ mA), the value ($R_T$) of test load resistor 48 would be chosen to be slightly less than 24,000 ohms. Mathematically, the value of test load resistor 48 is given by: $R_T \leq V_L/I_T \leq 120$ v/5 mA $\leq 24,000$ ohms. The highest standard resistor value below this value can be used. This allows for an economic design choice while ensuring that the fault current will be greater than 5 milliamps, since $I_F = V_L/R_T$ when test switch 50 is closed.

An analysis of FIG. 3 illustrates the cost savings and safety gains realized by eliminating shaft penetrations, especially in explosion-proof panelboards. In a preferred embodiment, a threaded shaft penetration 72 is depicted for push button actuator 28 and a threaded shaft penetration 76 is depicted for selection actuator 26, as are known in the art. Any combination of flat or threaded shafts could be used for these two actuators.

Referring still to FIG. 3, push button actuator 28 preferably comprises a threaded shaft 62, coil spring 60, and bearing 58. These parts are machined and assembled in accordance with Underwriters Laboratories Standard UL698, standard for industrial control equipment for use in hazardous (classified) locations. Prior to the present invention, it was customary to install this type of assembly in order to actuate each manual test button 34 on each GFCI circuit breaker 22 within the panelboard 20. If the number of GFCI circuit breakers 22 enclosed in panelboard 20 was given by n, then n push button actuators 28 were required for adequate testing. Similarly, in the preferred embodiment, selection actuator 26 comprises a threaded shaft 66 and bushing 64. Selection actuator 26 preferably is used to actuate rotary switch 52.

Each shaft penetration 72, 76 requires costly materials and labor intensive drilling, machining, and assembly. The present invention only requires two shaft penetrations through the panelboard 20 enclosure. A flamepath has also been eliminated for each shaft penetration eliminated. Thus, the costs and hazards of the actuator shaft penetrations have been reduced from n (the number of GFCI circuit breakers) to two (or to one if the selection actuator 26 and the push button actuator 28 are combined into a single actuator). Therefore, the present invention is safer, easier to use, and more economical than the prior art.

While a preferred embodiment of the invention has been shown and described, modifications thereof can be made by one skilled in the art without departing from the spirit of the invention.

What is claimed is:

1. A ground fault circuit interrupter ("GFCI") circuit breaker test circuit for panelboards, comprising:

a panelboard enclosure;

a plurality of GFCI circuit breakers, n, disposed within said panelboard enclosure, wherein each of the GFCI circuit breakers includes a corresponding load output terminal;

a plurality of test terminals, n, each of which is electrically connected to one of said corresponding load output terminals;

a circuit for testing each of said plurality of GFCI circuit breakers, said circuit for testing including a test load selectively connected to one of said test terminals by a selector switch; and said circuit for testing further including no more than two test actuators located externally to said panelboard enclosure enabling each of said plurality of GFCI circuit breakers to be tested without opening said panelboard enclosure.

2. A ground fault circuit interruptor circuit breaker test circuit for panelboards as in claim 1 further comprising a normally open switch for electrically connecting said selector switch to said test load.

3. A ground fault circuit interruptor circuit breaker test circuit for panelboards as in claim 1, wherein said test load is connected in series between said selector switch and ground.

4. A ground fault circuit interruptor circuit breaker test circuit for panelboards as in claim 3, wherein said test load comprises a resistor of a predetermined value R.

5. A ground fault circuit interruptor circuit breaker test circuit for panelboards as in claim 4, wherein said circuit breaker connects electrically to a load and applies a load voltage $V_L$ to said load except when a leakage current in excess of a predetermined value $I_T$ is detected.

6. A ground fault circuit interruptor circuit breaker test circuit for panelboards as in claim 5, wherein the value R is determined by $R < V_L I_T$.

7. A ground fault circuit interruptor circuit breaker test circuit for panelboards as in claim 2, wherein the selector switch comprises a rotary switch.

8. A ground fault circuit interruptor circuit breaker test circuit for panelboards as in claim 7, wherein one or two shaft penetrations are made in said panelboard enclosure for connecting said rotary switch and said normally open switch to said external test actuators.

9. A ground fault circuit interruptor ("GFCI") circuit breaker test circuit for panelboards, comprising:
   a panelboard enclosure;
   a plurality of GFCI circuit breakers disposed within the panelboard enclosure, each of which is connected electrically to a load terminal;
   a circuit for testing each of said plurality of GFCI circuit breakers, wherein said circuit for testing includes no more than two test actuators located externally to said panelboard enclosure enabling each of said plurality of GFCI circuit breakers to be tested without opening said panelboard enclosure; and
   said circuit for testing further comprises a test switch and a selector switch selectively connected to one of said load terminals, said test switch and said selector switch being activated by said external test actuator(s).

10. A test circuit as in claim 9, wherein said test switch comprises a normally open switch.

11. A test circuit as in claim 10, wherein said selector switch comprises a rotary switch.

12. A test circuit as in claim 9, further comprises a shaft penetration in said panelboard enclosure through which said test switch connects to one of said external test actuators.

13. A test circuit as in claim 12, further comprising a second shaft penetration in said panel enclosure through which said rotary switch connects to the other of said external test actuators.

14. A GFCI circuit breaker test circuit for panelboards as in claim 9, wherein said circuit for testing further includes a test load in series between said test switch and ground.

15. A GFCI circuit breaker test circuit for panelboards as in claim 14, wherein said test load comprises a resistor.

16. A ground test circuit interruptor ("GFCI") circuit breaker test circuit for panelboards, comprising:
   a panelboard enclosure;
   a plurality of GFCI circuit breakers disposed within said panelboards enclosure, wherein each of the GFCI circuit breakers includes a corresponding load output terminal;
   a circuit for testing each of said plurality of GFCI circuit breakers without opening said panelboard enclosure, said circuit for testing comprising:
      a selector switch for selectively connecting one of said corresponding load output terminals to said circuit;
      a test switch electrically connected to said selector switch;
      a test load electrically connected to said test switch; and
      no more than two shaft penetrations through said panelboard enclosure for connecting said selector switch and said test switch to no more than two test actuators being located externally to said panelboard enclosure.

17. A GFCI circuit breaker test circuit for panelboards as in claim 16, wherein said selector switch comprises a rotary switch.

18. A GFCI circuit breaker test circuit for panelboards as in claim 16, wherein said test switch comprises a normally open switch.

19. A GFCI circuit breaker test circuit for panelboards as in claim 16, wherein said test load comprises a resistor.

* * * * *